United States Patent
Ieong et al.

(10) Patent No.: US 7,348,611 B2
(45) Date of Patent: Mar. 25, 2008

(54) STRAINED COMPLEMENTARY METAL OXIDE SEMICONDUCTOR (CMOS) ON ROTATED WAFERS AND METHODS THEREOF

(75) Inventors: Meikei Ieong, Wappingers Falls, NY (US); Qiqing C. Ouyang, Yorktown Heights, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 11/112,820

(22) Filed: Apr. 22, 2005

(65) Prior Publication Data

US 2006/0237785 A1 Oct. 26, 2006

(51) Int. Cl.
*H01L 29/73* (2006.01)
(52) U.S. Cl. .................. 257/204; 257/274; 257/628; 257/E27.062; 257/E29.139
(58) Field of Classification Search ............... 257/627, 257/628, 255, 204, 274, 369, 371, 372, 19, 257/55, 616, E27.062, E27.066, E29.139
See application file for complete search history.

(56) References Cited

U.S. PATENT DOCUMENTS 5,729,045 A * 3/1998 Buynoski .................. 257/627
6,998,684 B2 * 2/2006 Anderson et al. ........... 257/351
2004/0217448 A1 * 11/2004 Kumagai et al. ........... 257/627
2004/0256614 A1 * 12/2004 Ouyang et al. .............. 257/20
2006/0145264 A1 * 7/2006 Chidambarrao et al. .... 257/369
2006/0202277 A1 * 9/2006 Hierlemann et al. ........ 257/369

OTHER PUBLICATIONS

Matsumoto, T. et al. Novel SOI Wafer Engineering Using Low Stress and High Mobility CMOSFET with <100>-Channel for Embedded RF/Analog Applications, IEDM, p. 663, 2002.
Okagaki, T. et al. Direct Measurement of Stress Dependent Inversion Layer Mobility Using a Novel Test Structure, IEEE Symposium on VLSI Technology, p. 120, 2004.
Komoda, T. et al. Mobility Improvement for 45nm Node by Combination of Optimized Stress Control and Channel Orientation Design, IEEE, 2004.

* cited by examiner

*Primary Examiner*—Long K. Tran
(74) *Attorney, Agent, or Firm*—Scully, Scott, Murphy & Presser; Ido Tuchman, Esq.

(57) ABSTRACT

The present invention provides CMOS structures including at least one strained pFET that is located on a rotated semiconductor substrate to improve the device performance. Specifically, the present invention utilizes a Si-containing semiconductor substrate having a (100) crystal orientation in which the substrate is rotated by about 45° such that the CMOS device channels are located along the <100> direction. Strain can be induced upon the CMOS structure including at least a pFET and optionally an nFET, particularly the channels, by forming a stressed liner about the FET, by forming embedded stressed wells in the substrate, or by utilizing a combination of embedded stressed wells and a stressed liner. The present invention also provides methods for fabricating the aforesaid semiconductor structures.

16 Claims, 5 Drawing Sheets

STRAINED COMPLEMENTARY METAL OXIDE SEMICONDUCTOR (CMOS) ON ROTATED WAFERS AND METHODS THEREOF

FIELD OF THE INVENTION

The present invention relates to semiconductor structures and to methods of fabricating the same. More particularly, the present invention relates to complementary metal oxide semiconductor (CMOS) structures including at least one strained p-type field effect transistor (pFET) that is located on a semiconductor substrate having a (100) crystal orientation that has been rotated so that the device channel is formed along the <100> direction. The CMOS structures of the present invention may also include strained nFETs as well as strained pFETs. The strained pFETs of the present invention have improved device performance which is caused by a combination of local channel stress and mobility enhancement caused by substrate rotation. In particular, the performance variation of pFETs that are formed on the rotated substrate are reduced because hole mobility is less sensitive to both transverse and longitudinal stress. Moreover, a single tensile stressed contact level liner can be used on both the nFETs and pFETs improving nFET performance with minimum degradation for pFETs, unlike the case on the normal wafers where an additional mask is needed to form a compressive liner or relax the tensile stress on pFETs using Ge implants.

BACKGROUND OF THE INVENTION

In the semiconductor industry, it has become more and more difficult in recent years to improve device performance. Mobility enhancement is a known way to improve complementary metal oxide semiconductor (CMOS) device performance, without excessive device scaling. For example, it is known that the electron and hole mobility are affected by the wafer surface orientations as well as the current flow directions. This is because of the anisotropic effective mass behaviors of the inversion layer carriers.

Currently, CMOS devices are formed on a Si-containing semiconductor substrate that has a single crystal orientation. In a typical semiconductor substrate, the surface orientation is defined as the surface normal vector out of the crystal plane of the semiconductor wafer. The current direction of a CMOS can be designed at device layout. Under normal operation, the CMOS current always flows from the source to the drain side modulated by the gate terminal. Therefore, the current flow direction can be controlled by rotating the gate conductor mask and active silicon masks with respect to the wafer notch. Another way of changing the channel direction is to rotate the wafer at 45 degrees and have the notch along <100> instead of <110> direction.

In one example, CMOS devices can be formed upon a Si-containing substrate having a (100) surface orientation, i.e., crystal plane, with a notch or wafer flat located at the <110> direction. Such a Si-containing wafer is shown in FIG. 1; in this figure G represents the gate, S represents the source region, D represents the drain region and the bolded arrow represents the direction of current flow. In the illustrated Si-containing semiconductor wafer, the current flow is the <110> direction for both nFETs and pFETs. For a (100) oriented semiconductor wafer, the current flow is typically insensitive to the current flow directions, if the gates are laid out either parallel or perpendicular to the wafer notch.

Another way of increasing the device performance is to induce a local mechanical stress upon the channel of the CMOS devices. In some technologies, the local mechanical stress created in the channel can degrade the carrier mobility and cause layout related performance variations. Moreover, the optimal stress type and direction with respect to current flow direction is different for nFETs and pFETs. Furthermore, the optimal stress type and current direction for nFETs and pFETs are not compatible with the requirements for advanced litho where the gates are oriented in one direction.

Recently, studies have shown that nFET devices on a 45° rotated (100) semiconductor wafer (in which the channel is along the <100> direction) could be more sensitive to a uniaxial stress effect (See, FIG. 2). Also, it has been shown that pFETs on rotated wafers could have higher performance than those on non-rotated wafers because of higher hole mobility. Furthermore, holes are less sensitive to the transverse compressive stress induced by a stress induced shallow trench isolation region, thus in such structures including a rotated wafer there is less performance degradation compared to a normal wafer.

Despite these advances, there is a need for providing strained CMOS structures, particularly strained pFETs, on rotated semiconductor wafers to improve the device performance and to couple that with local mechanical stress to improve the electron and/or hole mobility in the channel of the particular CMOS structure.

SUMMARY OF THE INVENTION

The present invention provides CMOS structures including at least one strained pFET that is located on a rotated semiconductor substrate to improve the device performance. Specifically, the present invention utilizes a Si-containing semiconductor substrate having a (100) crystal orientation in which the substrate is rotated by about 45° such that the CMOS device channels are located along the <100> direction. Strain can be induced upon the CMOS structure, particularly the channel, by forming a stressed liner about the pFET, by forming embedded stressed wells in the substrate, or by utilizing a combination of embedded stressed wells and a stressed liner. In the present invention, it is preferred to induce the stress by using at least one stressed well.

One advantage of fabricating the CMOS structure on a rotated wafer as described above is that one can have stressed CMOS structures without the need of using an additional mask. With single stressed liners (tensile), nFET performance will be improved (even more than on a normal wafers), while pFET performance will not be degraded because pFETs are less sensitive to the longitudinal stress on rotated wafers. In the present invention, one mask is saved compared to stressed CMOS structures on a normal wafer with either dual-stressed liners or a Ge implant to relax tensile stressed liners for pFETs.

Another benefit for fabricating CMOS structures on a rotated wafer is that narrow-width pFETs on a rotated wafer have higher $I_{on}$ per device width compared to the counterpart on the normal wafer. Because pFETs are less sensitive to the transverse stress on rotated wafers, they are not significantly degraded from the compressively stressed shallow trench isolation (STI).

Benefits that can be obtained by fabricating pFETs on rotated wafers containing embedded stressed wells include, for example, reduced short channel effects due to less boron diffusion in the embedded stressed well material as compared to Si. Also, although enhancement due to stress along the longitudinal direction (parallel to the channel) is not as high as in the devices on normal wafers with <110> channels, there is still an improvement over non-stressed pFETs on rotated wafers.

In broad terms, the CMOS structure of the present invention comprises:

a rotated Si-containing semiconductor substrate having a (100) crystal orientation and a wafer notch along the <100> direction;

at least one pFET located on a surface of said rotated Si-containing semiconductor substrate, said at least one pFET having a channel that is along said <100> direction; and at least one stressed material located at least within, or on, a surface of said rotated Si-containing semiconductor substrate that induces a stress on said channel of each pFET, wherein said at least one stressed material is a stressed well that includes a compressively strained material.

In some embodiment of the present invention, the stressed well can be used in conjunction with a stressed liner material. In yet other embodiments of the present invention, the structure includes at least one stressed material located at least within, or on, a surface of said rotated Si-containing semiconductor substrate that induces a stress on said channel of each pFET, wherein when the at least one stressed material is a stressed liner, the stressed liner is a compressively strained material. In yet other embodiments for CMOS applications, the stressed liner is under tensile strain.

The CMOS structure of the present invention may also include at least one nFET that is located on the Si-containing semiconductor substrate described above which lies adjacent to the at least one pFET. The at least one nFET will have a stressed channel because of the presence of the at least one stressed material.

Three possible embodiments are contemplated in the present invention. In one embodiment, the stressed material is a stressed liner that is located on the surface of the rotated Si-containing semiconductor substrate. In a preferred embodiment of the present invention, the stressed material is an embedded stressed well that is located within the surface Si-containing semiconductor substrate at the source/drain (S/D) regions. In a third embodiment of the present invention, the stressed material includes a combination of a stressed liner and an embedded stressed well. In embodiments in which a stressed liner is used, the liner is typically a compressive strained material since such a material is used with pFETs.

By using the embedded stressed well embodiment, compressive stress can be created in the nearby silicon area and it can improve hole mobility. In addition, by using a compressive liner at the local connect level, one can further enhance the stress and hence the hole mobility in the channel.

In addition to CMOS structures, the present invention also provides a method of fabricating such structures. In broad terms, the method of the present invention comprising the steps of:

rotating a Si-containing semiconductor substrate having a (100) crystal orientation such that a wafer notch is along the <100> direction; and forming at least one strained pFET located on a surface of said Si-containing semiconductor substrate, said at least strained one pFET having a stressed channel that is along said <100> direction.

DETAILED DESCRIPTION OF THE INVENTION

Figure 1:
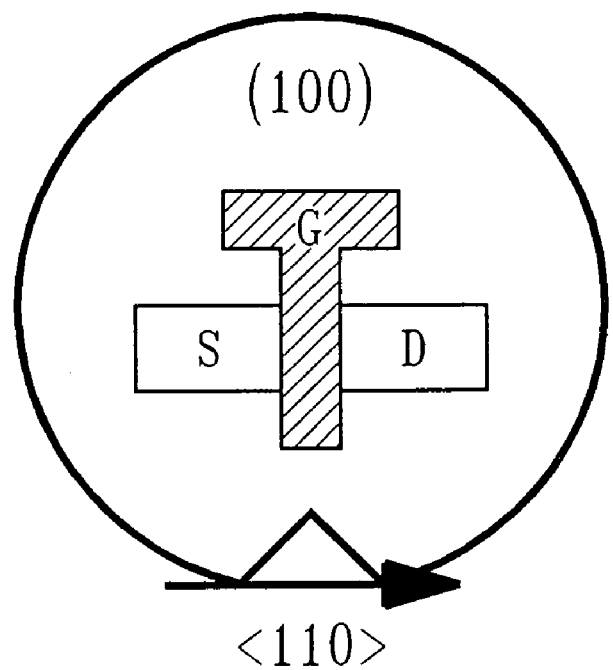
FIG. 1 is a schematic representation showing the channel orientation on a normal (100) Si-containing semiconductor substrate.

The present invention, which provides strained CMOS structures, particularly strained pFETs, on a rotated Si-containing semiconductor substrate and methods of fabricating such semiconductor structures, will now be described in greater detail by referring to the drawings that accompany the present application. It is noted that the drawings are provided for illustrative purposes and thus they are not drawn to scale.

As stated above, the present invention provides a strained CMOS, particularly a strained pFET, on a rotated (100) Si-containing semiconductor substrate. The inventive structures broadly comprise a Si-containing semiconductor substrate having a (100) crystal orientation, said Si-containing semiconductor substrate is rotated by about 45° such that the notch is along the <100> direction; at least one pFET located on a surface of said Si-containing semiconductor substrate, said at least one pFET having a channel that is along said <100> direction; and at least one stressed material located within, or on, a surface of said Si-containing semiconductor substrate that induces a stress on said channel of each pFET. For CMOS applications, and if a single stressed liner is used, it should be tensile, mainly to improve nFET performance because pFETs are less sensitive to the stress. Either tensile or compressive stress won't change pFET performance significantly. For pFETs only, then the liner should be compressive.

FIGS. 3-6 are pictorial representations of various examples of semiconductor structures that fall within the scope of the present application. A description of the inventive structure shown in FIGS. 3-6 will be provided first followed by the materials that are present in the structures. A general description of how each of the structures is formed will also be provided herein below.

Figure 2:
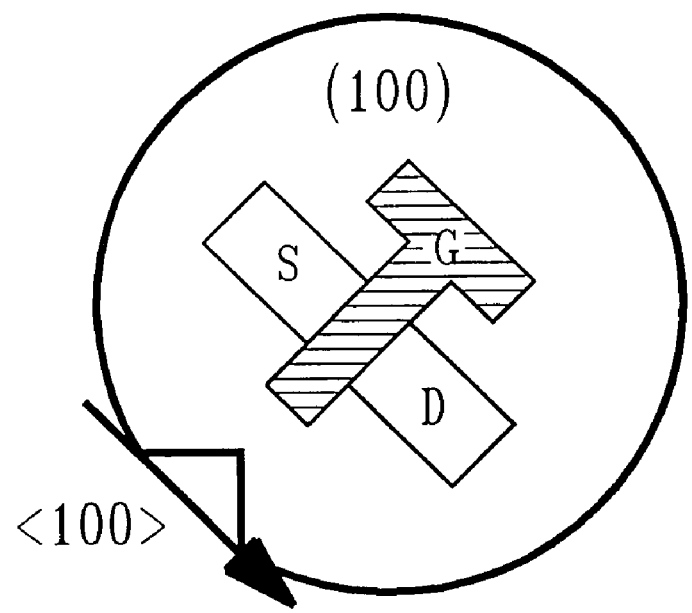
FIG. 2 is a schematic representation showing the channel orientation on a (100) Si-containing semiconductor substrate that has been rotated by 45° relative to the configuration shown in FIG. 1.

Before beginning these discussions, it is emphasized that in the present invention, a Si-containing semiconductor substrate having a (100) crystal orientation that is rotated by about 45° (relative to the substrate shown in FIG. 1) is employed. Such a Si-containing semiconductor substrate is shown, for example, in FIG. 2. As is shown therein, the Si-containing substrate that is employed in the present invention is rotated so that the wafer's notch is located along the <100> direction and hence the channels of the CMOS devices formed thereon are also located along the <100> direction. The rotation is performed utilizing techniques well known in the art.

The term "Si-containing semiconductor substrate" is used in the present invention to denote any Si-containing semiconductor material including, for example, Si, SiGe, SiGeC, SiC, silicon-on-insulators (SOIs), SiGe-on-insulators (SGOIs) or combinations of these materials. The substrate can be strained, unstrained or a combination of strained and unstrained, e.g., strained Si located on a relaxed SiGe layer, or a strained SiGe on relaxed Si can be used. The substrate can be intrinsic or it can be doped with, for example, but not limited to: B, As, or P.

Structures of the Present Invention

Figure 3:
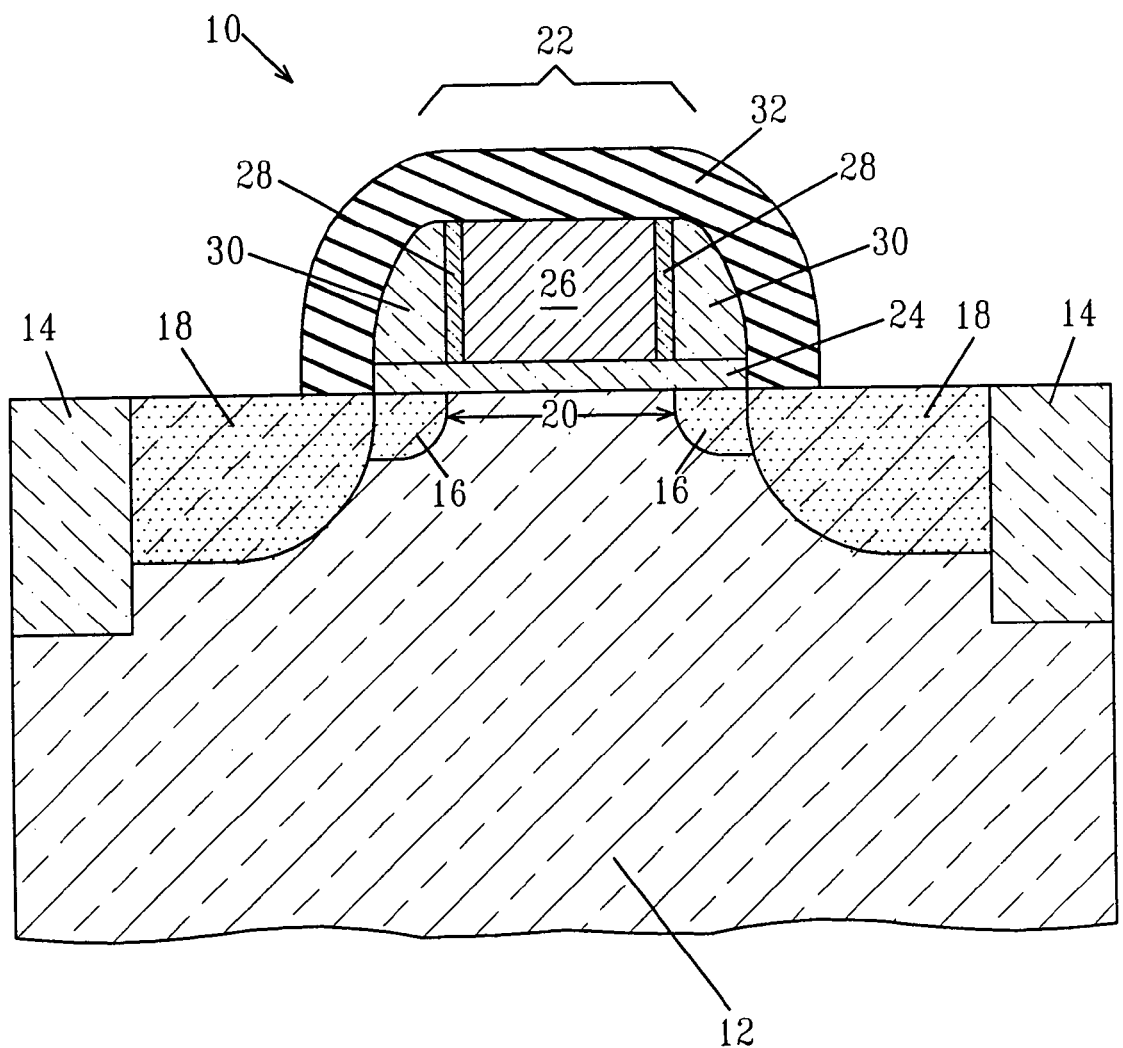
FIG. 3 is a pictorial representation (through a cross sectional view) illustrating a strained pFET on a rotated Si-containing semiconductor substrate using a compressively stressed liner material at the local connect level.

Reference is first made to the semiconductor structure 10 shown in FIG. 3 which includes a Si-containing semiconductor substrate 12, as described above and as depicted in FIG. 2, and at least one pFET 22 located on a surface of the Si-containing semiconductor substrate 12. Each pFET 22 includes at least a gate dielectric 24, a gate conductor 26, and at least one sidewall spacer 30. Optionally, the sidewalls of each pFET 22, particularly the gate conductor 26, may include a passivation layer 28 located thereon.

Isolation regions 14 are located within the rotated Si-containing semiconductor substrate 12 to isolate pFET devices from pFET devices, or more particularly, pFET devices from nFET devices (not shown). The nFETs would be located to the periphery of the device region shown in the drawings of the present application and they would have the opposite polarity as compared to the pFET. The nFETs are comprised of the same components as the pFETs and they are made utilizing the same basic processing steps. Each pFET 22 also includes source/drain (S/D) extensions 16 and source/drain (S/D) regions 18. A channel 20 that is stressed is located underneath each pFET. In the embodiment illustrated in FIG. 3, the stressed channel 20 is formed by having at least one stressed liner 32 located atop the substrate 12 and around each pFET 22. Since pFETs are specifically used in the present invention, the stressed liner 32 is under compressive stress.

Figure 4:
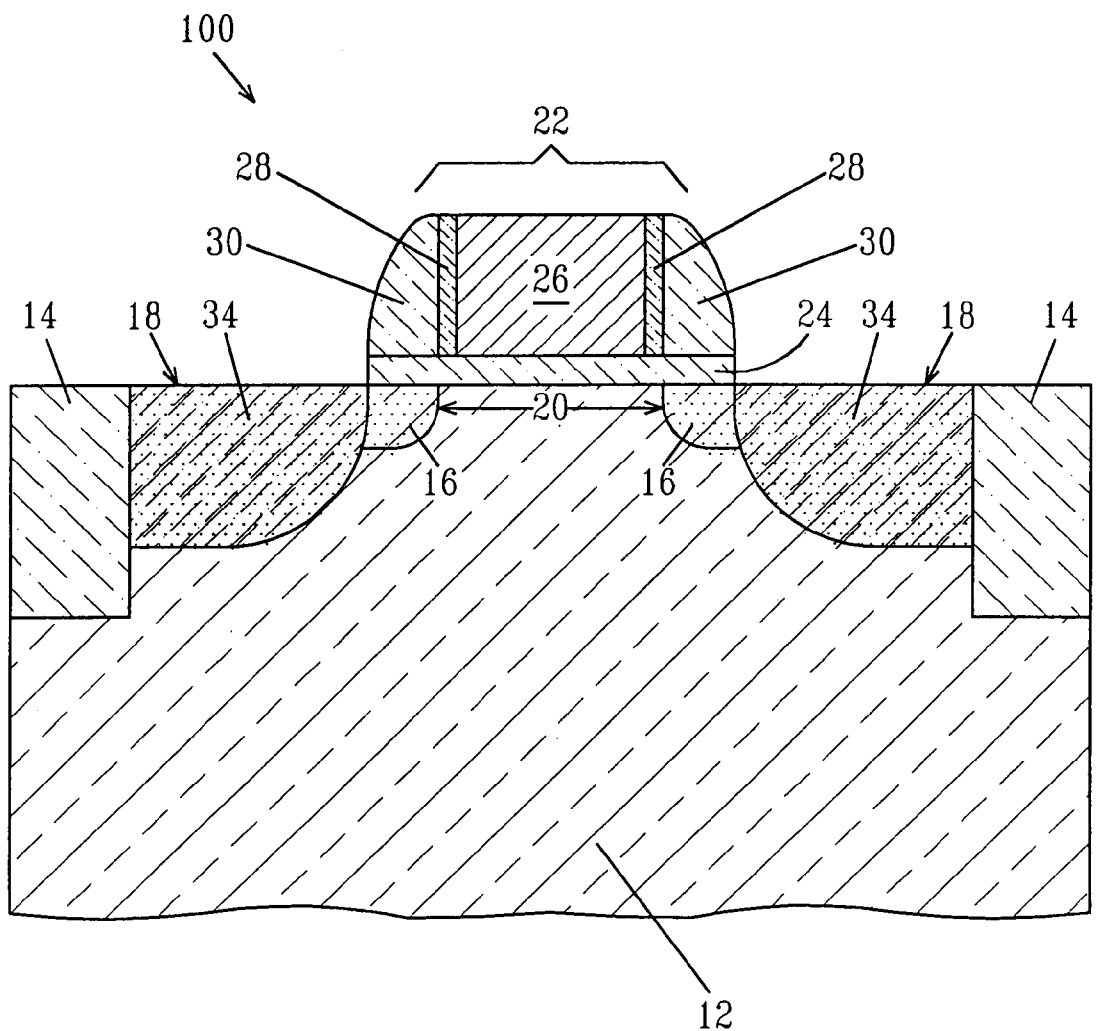
FIG. 4 is a pictorial representation (through a cross sectional view) illustrating a strained pFET on a rotated Si-containing semiconductor substrate using an embedded stressed well.
Figure 5:
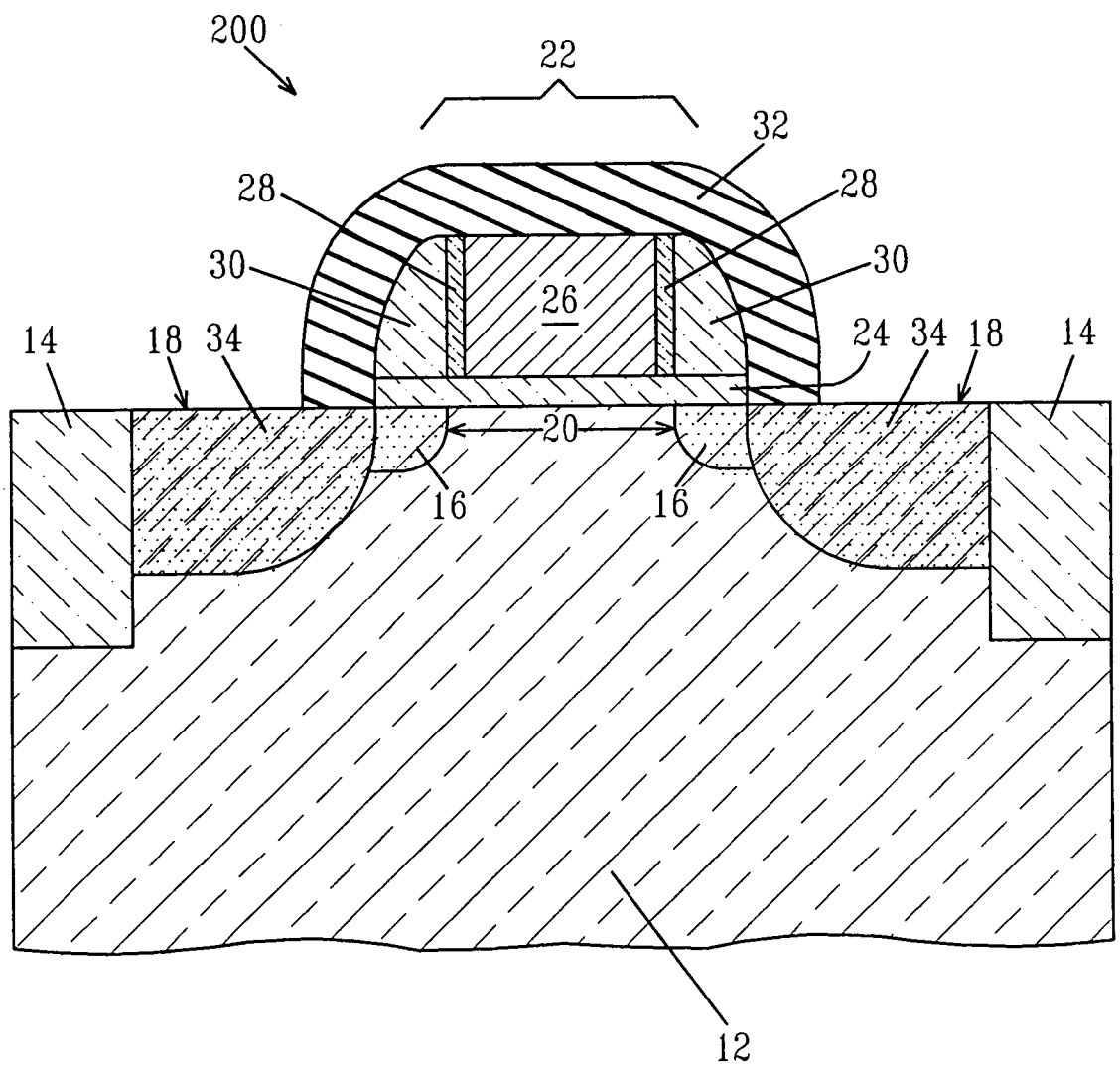
FIG. 5 is a pictorial representation (through a cross sectional view) illustrating a strained pFET on a rotated Si-containing semiconductor substrate using a combination of a compressively stressed liner material and an embedded stressed well.

FIG. 4 shows a structure 100 that is similar to the one depicted in FIG. 3 except that the stressed channel 20 is formed by an embedded well 34 that is within the source/drain regions 18 instead of the stressed liner 32. FIG. 5 shows another possible structure 200 of the present invention that includes both a stressed liner 32 and an embedded stressed well 34.

Figure 6:
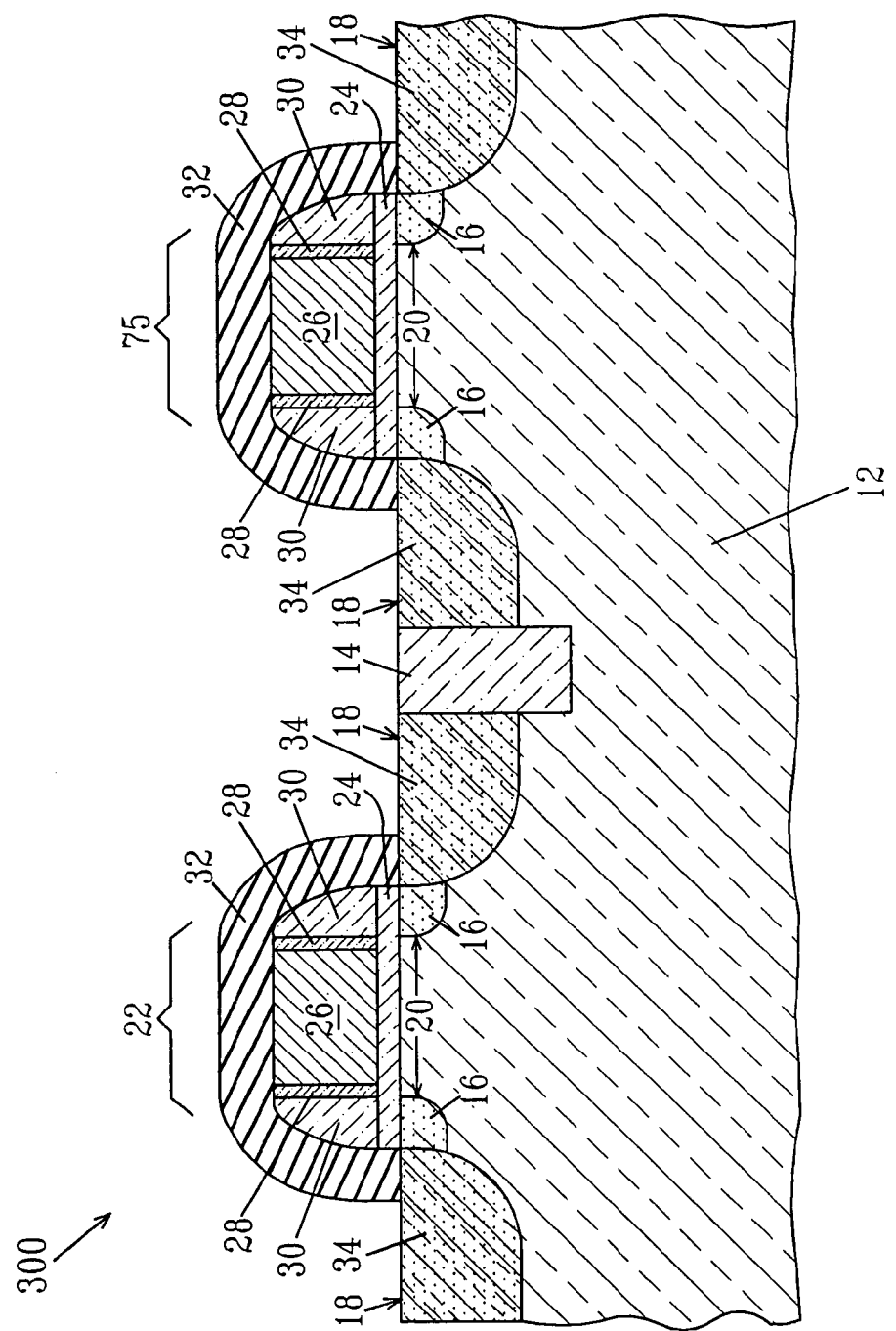
FIG. 6 is a pictorial representation (through a cross sectional view) illustrating a CMOS structure on a rotated Si-containing semiconductor substrate containing an nFET and a pFET, an optional stressed liner on both the FETs and embedded stressed wells.

It is noted that in each of FIGS. 3-5 at least one nFET can be present adjacent to the pFET illustrated in the drawings. The at least one nFET is isolated from the at least one pFET by a device isolation region, typically a STI region or a field oxide isolation region. FIG. 6 shows a CMOS structure 300 that includes a pFET 22 and an nFET 75. The nFET includes the same basic components as the pFET except that it has the opposite doping type. The pFET is separated from the nFET by isolation region 14. The illustrated structure also includes an embedded stressed well 34 and a tensile stressed liner 32 on both the nFET and the pFETs. It is emphasized that the CMOS structure include nFETs and pFET may comprise a stressed liner material only, an embedded stressed liner material only, or a combination of these two stressed materials as shown in FIG. 6.

One advantage of fabricating the CMOS on a rotated wafer is that one can have stressed CMOS structures without the need of using an additional mask. With single stressed liners (tensile), nFET performance will be improved (even more than on a normal wafers), while pFET performance will not be degraded because pFETs are less sensitive to the longitudinal stress on rotated wafers. In the present invention, one mask is saved compared to stressed CMOS structures on a normal wafer with either dual-stressed liners or a Ge implant to relax tensile stressed liners for pFETs.

Another benefit for fabricating CMOS on a rotated wafer is that hole mobility is higher compared to normal wafers.

In addition, another benefit for fabricating CMOS structures on a rotated wafer is that narrow-width pFETs on a rotated wafer have higher $I_{on}$ per device width compared to the counterpart on the normal wafer. Because pFETs are less sensitive to the transverse stress on rotated wafers, they are not significantly degraded from the compressively stressed shallow trench isolation (STI).

Benefits that can be obtained by fabricating pFETs on rotated wafers containing embedded stress wells include, for example, reduced short channel effects due to less boron diffusion in the embedded well material as compared to Si. Also, although enhancement due to stress along the longitudinal direction (parallel to the channel) is not as high as in the devices on normal wafers with <110> channels, there is still an improvement over non-stressed pFETs.

Material Components for the Inventive Structures Shown in FIGS. 3-6

This section provides a description of the various materials that can be present in the structures of the present invention.

Common to each of the structures is the rotated (100) Si-containing semiconductor substrate 12 that has been described in greater detail herein above. As stated above, the rotated (100) Si-containing semiconductor substrate allows for the channels of each FET to be oriented in the <100> direction.

In addition to the rotated Si-containing semiconductor substrate 12, each structure includes at least one pFET 22 located on a surface of the substrate 12. As indicated above, each pFET 22 includes a gate dielectric 24, a gate conductor 26, and at least one sidewall spacer 30. Optionally, a passivation layer 28 is present on the sidewall of the gate conductor 26. Note the at least one nFET 75 shown in FIG. 6 includes the same components, i.e., gate dielectric, gate conductor, and at least one sidewall spacer as the pFET 22. The at least one nFET 75 may also include the optional passivation layer. It is noted that although the nFET and the pFET include the same components, the components of the nFET and the pFET may have the same or different compositions. The at least one nFET 75 will also include source/drain diffusion regions, source/drain extensions and a channel as described hereinbelow for the pFET 22.

The gate dielectric 24 can be comprised of any insulating material. For example, the gate dielectric 24 can be comprised of an oxide, nitride, oxynitride or any combination thereof including multilayers. Preferably, the gate dielectric 24 is comprised of an oxide such as, for example, $SiO_2$. The gate conductor 26 can be comprised of any conductive material, including, for example, polySi, SiGe, a metal, a metal alloy, a metal silicide, a metal nitride or combinations including multilayers thereof. When multilayers are present, a diffusion barrier (not shown), such as TiN or TaN, can be positioned between each of the conductive layers. A capping layer (also not shown), such as an oxide, or nitride, can be located atop the gate conductor 26. The at least one spacer 30 that is present is typically comprised of an oxide, nitride or oxynitride including combinations and multilayers thereof. In embodiments in which the passivation layer 28 is present, that layer is typically comprised of an oxide, nitride or oxynitride.

Each pFET 22 also includes S/D extensions 16 and S/D regions 18 which, together with the gate conductor 26 define the length of the channel 20. The S/D extensions 16 and S/D regions 18 are comprised of a semiconductor material (i.e., substrate 12 or embedded stress well 34) that has been doped with either n-or p-type dopants by ion implantation and/or by in-situ doping during epitaxial growth. The S/D extensions 16 are typically shallower in depth than the S/D regions 18.

FIGS. 3-6 also show the presence of isolation regions 14 which are typically trench isolation regions that are comprised of at least a trench dielectric material such as an oxide. Alternatively, the isolation regions 14 may be field oxide isolation regions that are comprised of an oxide produced by a local oxidation of silicon process.

In some of the structures, e.g., see the structures shown in FIGS. 3 and 5, a stressed liner 32 is shown on top of portions of the substrate 12 as well the pFET 22. The stressed liner 32 may comprise a single layer or multiple layers.

The stressed liner 32 is comprised of any stress inducing material such as a nitride or a high density plasma (HDP) oxide, or a combination thereof. The stressed liner 32 can formed by various chemical vapor deposition (CVD) processes such as low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modem metalorganic precursor for CVD application. The later process provides a low temperature nitride film having high stress. The stress inducing materials, which are employed in the present invention, are under compressive stress if only pFET is present because such material typically increase hole mobility. However, on rotated wafers, the liners can be tensile stressed for CMOS to improve nFETs with minimum degradation on pFETs.

In some embodiments of the present invention, e.g., see the structures shown in FIGS. 4-5, an embedded stressed well 34 is present. The embedded stressed well 34 is typically comprised of a semiconductor material that includes pure Si or Si containing C. and/or Ge. Illustratively, the embedded stressed well 34 can comprise Si, SiC, SiGe or SiGeC. Typically, a Ge-containing well is used for pFETs, and Si or SiC for nFETs. These epitaxially grown embedded wells may be intrinsic or they may be doped with, for example, B, As, or P. In yet another embodiment, extension regions 16 such as shown, for example in FIG. 4, 16 can also be stress-inducing material, together with region 34.

FIG. 6 shows a CMOS structure that includes a pFET, an nFET, a stressed liner and embedded stressed well as defined above. It is emphasized that the CMOS structure including the nFET and the pFET may comprise a stressed liner material only, an embedded stressed liner material only, or a combination of these two stressed materials as shown in FIG. 6.

Processing

In general terms, the present invention provides a method for fabricating the structures shown in FIGS. 3-6 which includes the steps of rotating a Si-containing semiconductor substrate having a (100) crystal orientation such that the wafer's notch is along the <100> direction; and forming at least one strained pFET located on a surface of said Si-containing semiconductor substrate, said at least strained one pFET having a stressed channel that is along said <100> direction. In FIG. 6, a least one nFET 75 is shown. The nFET 75 also has a stressed channel that is along the <100> direction. The different conductivity type FETs are formed utilizing conventional processes that may include the use of block masks which allow for the fabrication of one of the FETs, while the area for the other FET is protected.

The first step of the present invention, i.e., rotating the Si-containing semiconductor structure 12, is achieved by utilizing processing techniques that are well known to those skilled in the art.

Isolation regions 14 can be formed at this time of present invention utilizing processing well known to those skilled in the art including trench isolation formation by first defining a trench into the substrate via lithography and etching. Following the etching step, an optional trench dielectric liner and a trench dielectric are then formed into the trench. Alternatively, a local oxidation of silicon process can be used to define the trench.

Next, at least one pFET 22 is formed on the active area of the rotated Si-containing semiconductor substrate 12. The pFET 22 is formed utilizing any conventional CMOS process that is capable of forming a pFET. One method includes the steps of forming a layered stack comprising a gate dielectric and a gate conductor on each of the planar surfaces of the substrate. The gate dielectric can be formed by a thermal process such as oxidation or by a conventional deposition process such as chemical vapor deposition (CVD), plasma enhanced CVD, evaporation, atomic layer deposition and other like deposition processes.

The gate conductor is formed by a deposition process such as CVD, PECVD, sputtering, plating, evaporation, atomic layer deposition and the like. When polySi or SiGe gates are used, the conductive material can be doped in-situ or following deposition by ion implantation. Implantation masks and ion implantations are used to form FETs of different conductivities. Following the formation of the layered stack, at least the gate conductor (and optionally the gate dielectric) is patterned by lithography and etching. A thermal process can then be used to form the passivation layer. Thereafter, S/D extensions are formed by ion implantation and annealing. Sidewalls spacers are then formed by deposition and etching and thereafter the S/D regions are formed by ion implantation and annealing. The annealing step used for activating the S/D extension can be omitted and activation can occur during the activation of the S/D regions.

In cases in which a stressed liner is present, the stressed liner is formed by deposition and etching, after the at least one pFET device has been formed. Examples of deposition processes that can be used include, CVD, PECVD or RTCVD. The etching step includes providing a patterned resist over portions of the stressed inducing layer and then etching the exposed portions of the stressed liner.

In cases in which the embedded stressed wells are formed, the pFET device is first provided in each of the active areas of the substrate. Next, exposed portions of the substrate are recessed by an etching process (RIE and/or wet etch), preferably to provide a slight undercut beneath each of the spacers. That is, a selective anisotropic or isotropic etching process can be used to remove portions of the hybrid oriented substrate. The isotropic etch provides the slight undercut beneath the spacers. Following the recessing process in which an etch is used, the etched surfaces are cleaned utilizing any cleaning process that can remove contaminates including residual oxides from the recessed surfaces. A selective epitaxial growth process (RTCVD or UHVCVD) can than be used to form the embedded wells. In embodiments in which RTCVD (rapid thermal CVD) is used, the following conditions are typically used: deposition temperature of about 500° C. to about 1000° C., pressure from about 5 to about 100 Torr, and a precursor comprising a Si source such as a silane, a disilane, or a dichlorosilane, a Ge source such as $GeH_4$ or a C source such as an alkene. Alternatively, it is possible that the embedded stressed wells can be formed by gas phase doping into the S/D regions.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A complementary metal oxide semiconductor (CMOS) structure comprising:
    a rotated Si-containing semiconductor substrate having a (100) crystal orientation and a wafer notch along a <100> direction;
    at least one pFET located on a surface of said rotated Si-containing semiconductor substrate, said at least one pFET having a channel that is along said <100> direction; and
    at least one stressed material located at least within, or on, a surface of said rotated Si-containing semiconductor substrate that induces a stress on said channel of each pFET, wherein said at least one stressed material is a stressed wall that includes a compressively strained material.

2. The CMOS structure of claim 1 wherein said rotated Si-containing semiconductor substrate comprises a Si-containing semiconductor material selected from the group consisting of Si, SiGe, SiC, SiGeC, silicon-on-insulators, silicon germanium-on insulators and combinations thereof.

3. The CMOS structure of claim 1 wherein said rotated Si-containing semiconductor substrate is strained, unstrained or a combination of strained and unstrained layers.

4. The CMOS structure of claim 1 further comprising at least one isolation region located within said rotated Si-containing semiconductor substrate.

5. The CMOS structure of claim 1 wherein said at least one pFET comprises a gate dielectric, a gate conductor, at least one sidewall spacer, source/drain extensions and source/drain regions.

6. The CMOS structure of claim 1 wherein said stressed liner comprises a nitride, a high density plasma oxide, or combinations thereof.

7. The CMOS structure of claim 1 wherein said embedded stressed well comprises Si or Si containing at least one of C or Ge.

8. The CMOS structure of claim 7 wherein said embedded stressed well comprises SiGe.

9. The CMOS structure of claim 1 wherein said stressed well includes source and drain diffusion regions and source and drain extension regions.

10. The CMOS structure of claim 1 further comprising at least one nFET located adjacent to said at least one pFET.

11. The CMOS structure of claim 10 wherein said at least one nFET is under stress, said stress is caused by said at least one stressed material.

12. The CMOS structure of claim 11 wherein said stressed material further includes a stressed liner.

13. The CMOS structure of claim 11 wherein said stressed material includes an embedded stressed well comprising Si or Si containing at least one of C or Ge.

14. The CMOS structure of claim 10 wherein said stressed material comprises a combination of a stressed liner and said embedded stressed well.

15. The CMOS structure of claim 14 wherein said stressed liner comprises a compressive nitride and said embedded stressed well comprises SiGe.

16. A complementary metal oxide semiconductor (CMOS) structure comprising:
    a rotated Si-containing semiconductor substrate having a (100) crystal orientation and a wafer notch along a <100> direction;
    at least one pFET located on a surface of said rotated Si-containing semiconductor substrate, said at least one pFET having a channel that is along said <100> direction; and
    at least one stressed material located at least within, or on, a surface of said rotated Si-containing semiconductor substrate that induces a stress on said channel of each pFET, wherein when the at least one stressed material includes at least a stressed liner and a stressed well, where the stressed liner is a compressively strained material.

* * * * *